United States Patent [19]
Banyai et al.

[11] Patent Number: 6,128,220
[45] Date of Patent: Oct. 3, 2000

[54] APPARATUS FOR ENABLING EEPROM FUNCTIONALITY USING A FLASH MEMORY DEVICE

[75] Inventors: Chris J. Banyai, Chandler; Robert H. Brown, Queen Creek, both of Ariz.

[73] Assignee: Intel Corporation, Santa Clara, Calif.

[21] Appl. No.: 09/235,064

[22] Filed: Jan. 21, 1999

[51] Int. Cl.[7] ........................................... G11C 16/04

[52] U.S. Cl. ...................... 365/185.11; 365/185.05; 365/230.03

[58] Field of Search ............... 365/185.05, 185.29, 365/185.35, 185.11, 230.03, 63

[56] References Cited

U.S. PATENT DOCUMENTS 5,812,452  9/1998  Hoang ............................. 365/185.11
5,835,409  11/1998  Lambertson .................... 365/185.15

*Primary Examiner*—Son T. Dinh
*Assistant Examiner*—Hien Nguyen
*Attorney, Agent, or Firm*—Blakely, Sokoloff, Taylor & Zafman LLP

[57] ABSTRACT

An apparatus for enabling EEPROM functionality using a flash memory device comprises a number of bytes of non-volatile memory. The flash memory device has per-byte source isolation and per-byte drain isolation of a number of non-volatile flash memory cell transistors. The flash memory device provides a byte-alterable non-volatile memory.

9 Claims, 5 Drawing Sheets

APPARATUS FOR ENABLING EEPROM FUNCTIONALITY USING A FLASH MEMORY DEVICE

FIELD OF THE INVENTION

The present invention relates to the field of memory devices and, more particularly, to providing a word-alterable or byte-alterable non-volatile flash memory.

BACKGROUND OF THE INVENTION

As a result of the proliferation of microprocessors, many modern systems use embedded microprocessor-based systems for subsystem control and for adaptive parameter and code storage. The systems using embedded microprocessor-based systems include personal computers, automotive and airplane control systems, cellular telephones, digital cameras, and handheld communication devices. The embedded systems used in automotive applications, for example, comprise small amounts of embedded non-volatile memory for adaptive parameter and code storage for engine controls, supplemental restraint systems, anti-lock braking systems, and transmission control systems.

The typical embedded systems use electrically erasable programmable read-only memory (EEPROM) as the non-volatile memory for adaptive parameters. The EEPROM is used because, in automotive applications for example, it provides the ability to read, program, and erase a single byte with high reliability for over 100,000 program/erase cycles at the extreme temperatures of the automotive environment, temperatures ranging from −40 degrees Celsius to 125 degrees Celsius. The problem with the EEPROM is that in the typical embedded system the EEPROM is not located on the same integrated circuit as the associated microcontroller. This design proves to be expensive because of the additional hardware required and the additional serial protocol required to communicate with the off-chip EEPROM.

A typical flash memory device has the same array configuration as a standard EEPROM and can be programmed in a similar fashion as the standard EEPROM. The size of a typical flash memory array allows the flash memory to be located on the same integrated circuit chip as the associated microcontroller; the typical flash memory, however, cannot provide EEPROM functionality because it cannot have data rewritten to the same address location without first erasing a large portion or block of memory comprising a number of memory cells. Once programmed, either the entire contents of the flash memory or a block of the flash memory can be erased by electrical erasure in one relatively rapid operation.

An erasing voltage is made available to the sources of all the cells in the flash memory or in one block of the flash memory. This results in a full array erasure or a block erasure. The flash memory or the erased block of the flash memory may then be reprogrammed with new data.

The typical flash memory cell is not byte alterable because the high voltages and long time necessary to perform erase operations cause cells coupled to common wordlines and bitlines to experience disturb conditions. These disturb conditions are the result of voltages that cause a change in the cell threshold voltage of the memory cell by adding or removing electrons from the floating gates. Furthermore, programming operations also cause disturb conditions. Consequently, the number of program/erase cycles available from the typical flash memory used in automotive applications is limited to approximately 1000.

Three types of disturb conditions are manifested during the programming and erasing of cells in a typical flash array. One type of disturb condition is a gate disturb, or DC programming. The gate disturb affects memory cells coupled to a common wordline. The gate disturb occurs when a 12 volt signal is applied to a common wordline of an erased bit having a source and drain held at a potential of zero volts. This gate disturb causes electrons to move to the floating gate, thereby programming the floating gate of the memory bits coupled to the common wordline. Another type of disturb condition affecting memory cells of a common wordline is a DC erase. The DC erase occurs when a 12 volt signal is applied to the gate of a programmed cell and the electrons leave the floating gate, as in a memory cell erase.

A drain disturb, or program disturb, affects memory cells coupled to a common bitline. Drain disturb occurs during programming when a signal is applied on a common bitline drain on a programmed cell. This disturb causes electrons to depart the floating gate, as in a memory cell erase. Consequently, there is a need for a non-volatile memory device that is byte-alterable and that can provide approximately 100,000 program/erase cycles in the automotive environment.

SUMMARY

An apparatus for enabling EEPROM functionality using a flash memory device is described. In some embodiments, the flash memory device comprises a number of bytes of non-volatile memory. The flash memory device has per-byte source isolation and per-byte drain isolation of a number of non-volatile flash memory cell transistors. The flash memory device provides a byte-alterable non-volatile memory.

Other features and advantages of the present invention will be apparent from the accompanying drawings and from the detailed description and appended claims that follow below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

An apparatus for enabling EEPROM functionality using a flash memory device is described. The flash memory device comprises a number of bytes of non-volatile memory comprising per-byte source isolation and per-byte drain isolation of memory cell transistors. Intended advantages of the memory device can include providing EEPROM functionality integrated in a microcontroller and reducing memory cell redundancy in a memory array.

Figure 1:
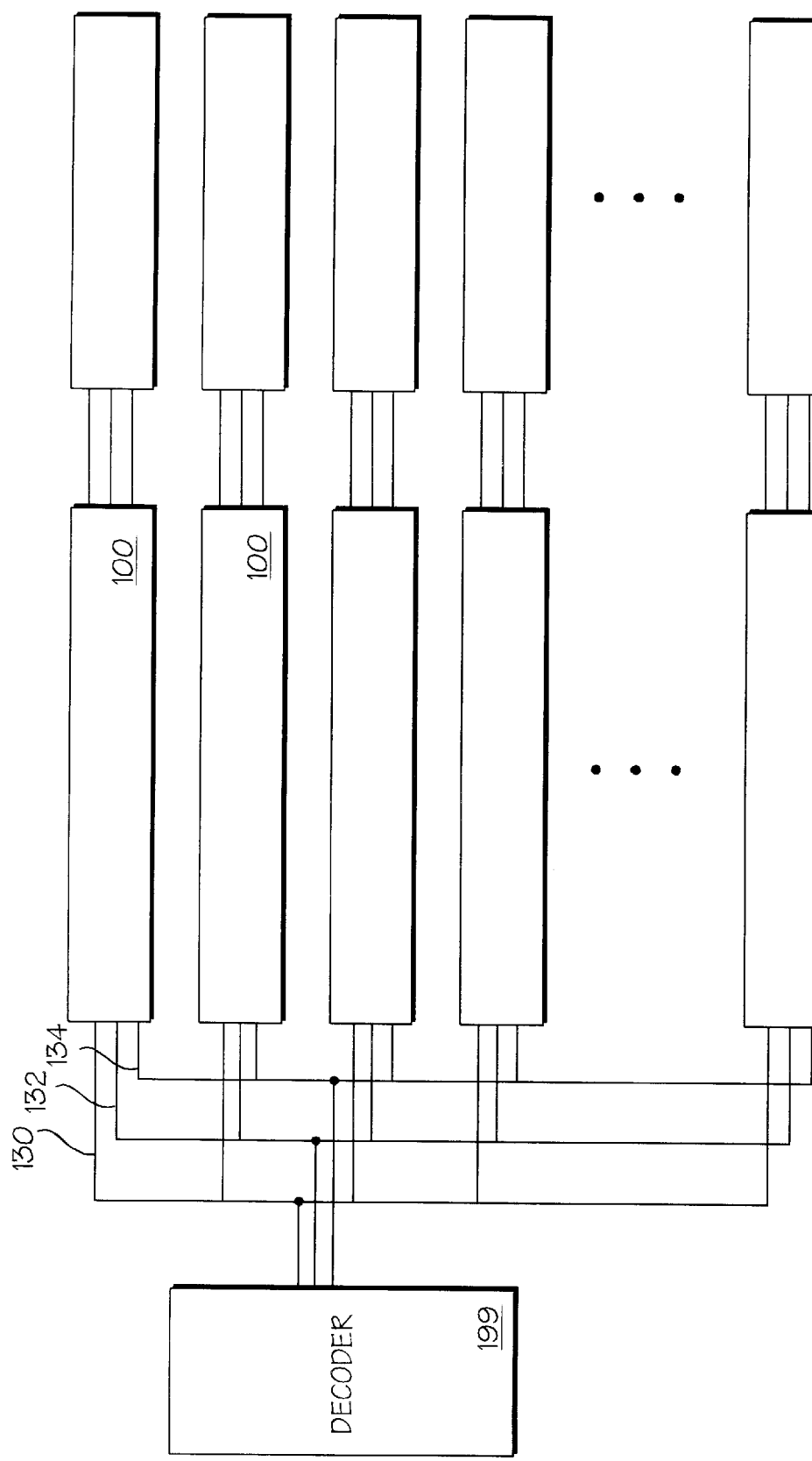
FIG. 1 is a byte-alterable flash array of an embodiment of the present invention.

FIG. 1 is a byte-alterable flash array of an embodiment of the present invention. The flash array comprises a number of memory cells arranged to form bytes 100 of memory. In one embodiment, the byte-alterable flash array comprises 256 to 1000 words, but the embodiment is not so limited. A decoder 199 selects the bytes 100 for programming and erasing using drain select signals 130, wordline signals 132, and source select signals 134, but the embodiment is not so limited.

Figure 2:
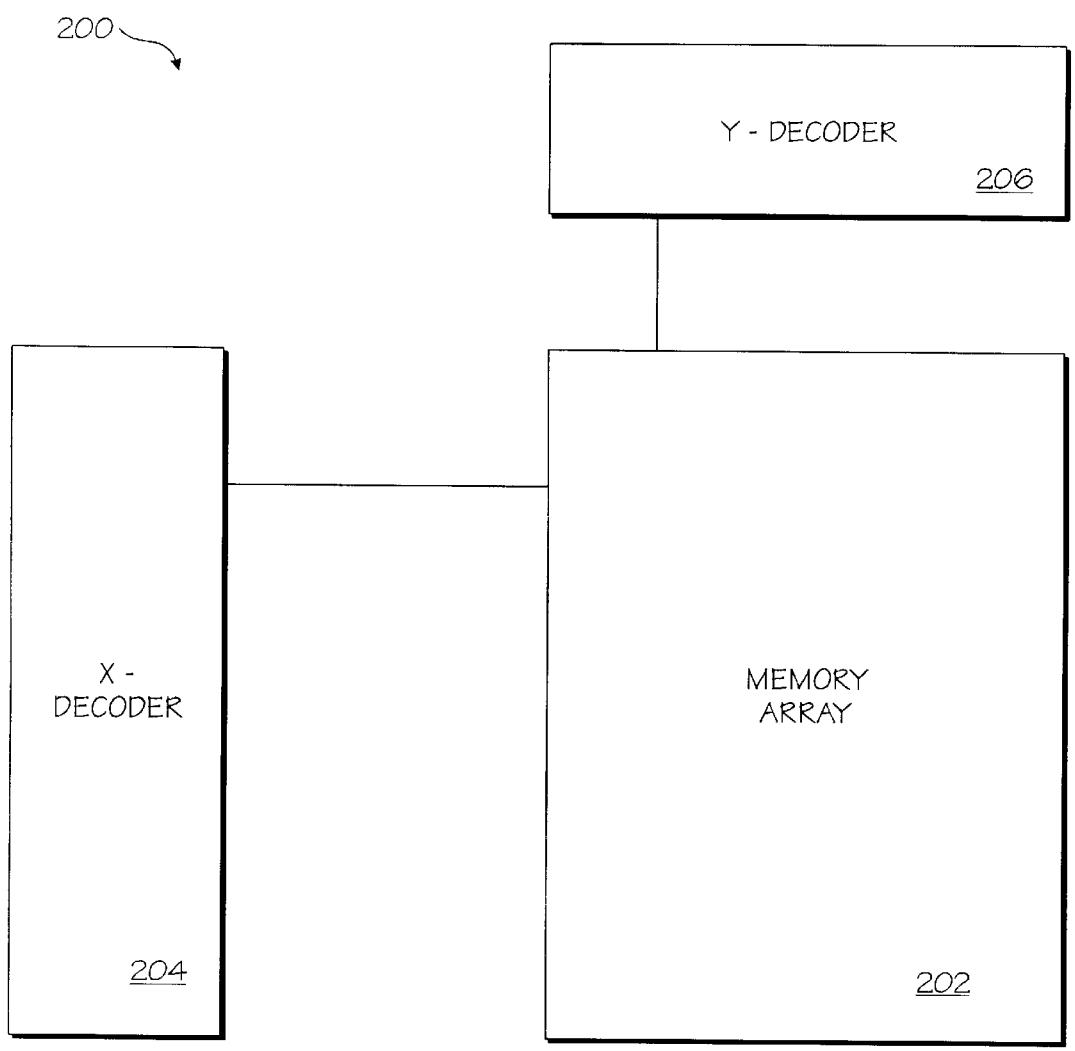
FIG. 2 is a memory device of an embodiment of the present invention.

FIG. 2 is a memory device 200 of an embodiment of the present invention. The memory device 200 comprises a memory array 202. The memory array 202 comprises byte-alterable, word-alterable, nibble-alterable, and double word-alterable flash arrays depending on the configuration and use of the memory array 202, but it is not so limited. The memory cells of the memory array 202 are selected for programming and erasing using an x-decoder 204 and a y-decoder 206. The x-decoder 204 selects the memory cells for programming and erasing using drain select and source select signals, but is not so limited. The y-decoder 206 selects the memory cells for programming and erasing using main source and wordline select signals, but is not so limited.

Figure 3:
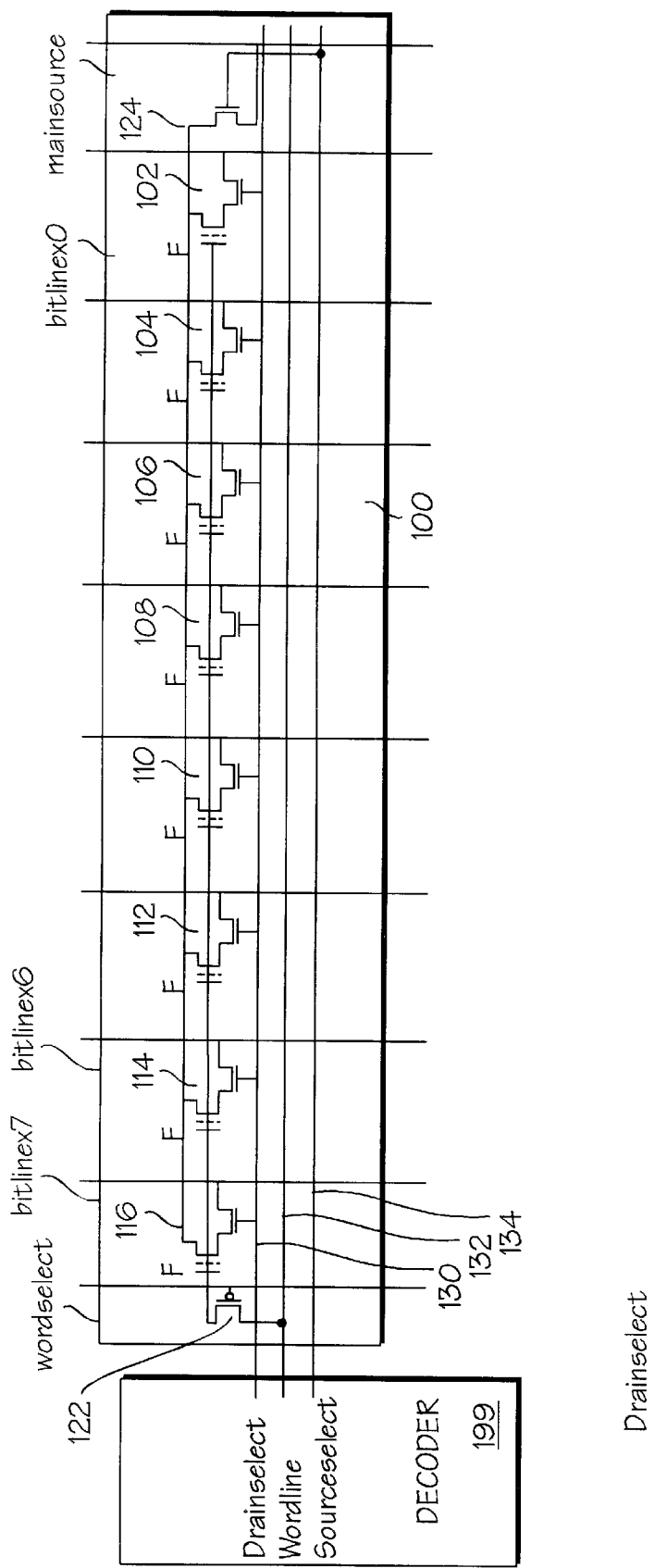
FIG. 3 is a byte of a byte-alterable flash array of an embodiment of the present invention.
Figure 4:
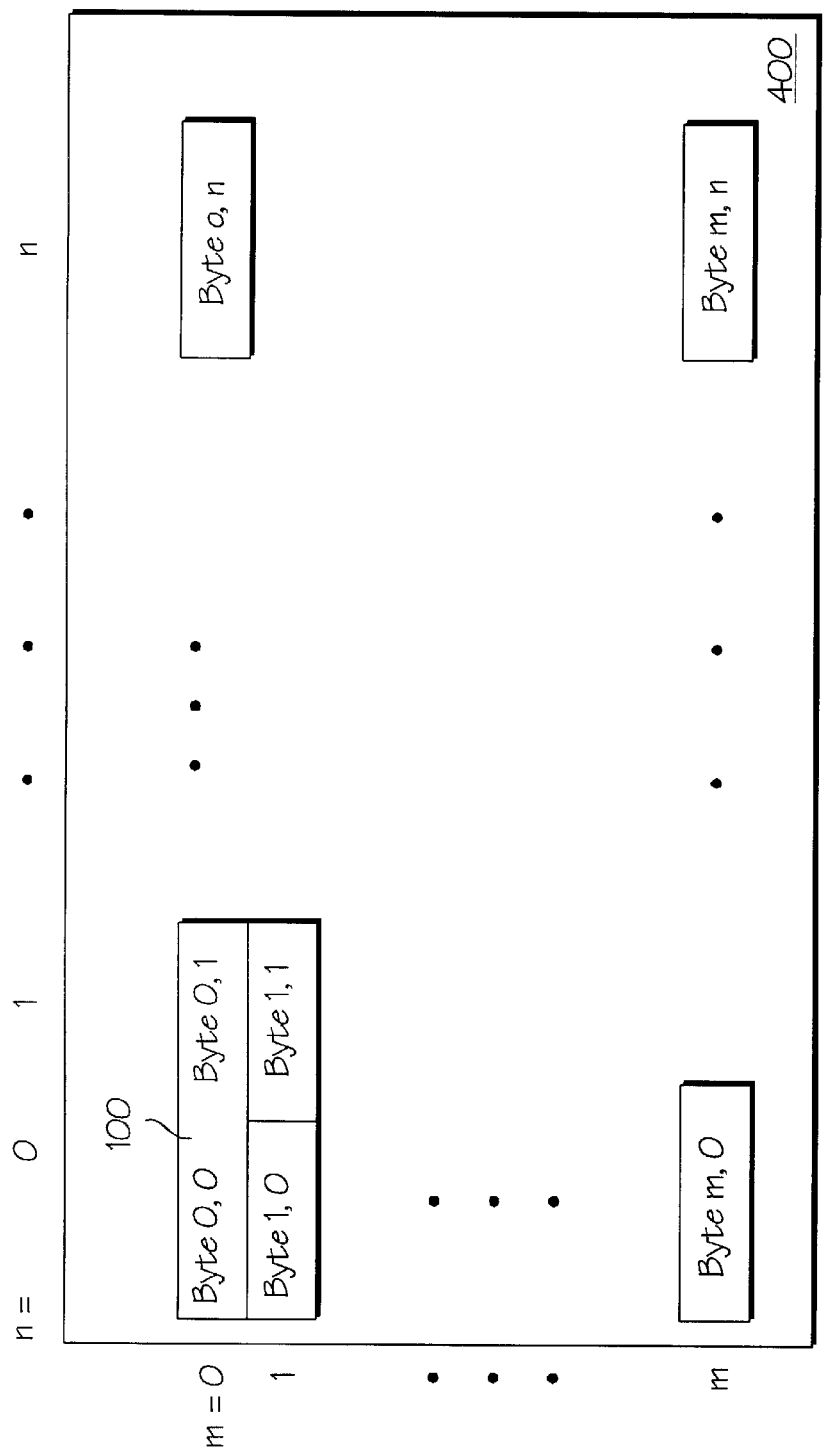
FIG. 4 is a flash array comprising a number of bytes of an embodiment of the present invention.

FIG. 3 is a byte 100 of a byte-alterable flash array of an embodiment of the present invention. Each byte 100 comprises eight memory cells 102–116, or bits. The flash array of one embodiment is a byte adjacent array because all of the bits 102–116 of one byte 100 are physically located next to each other; this is in contrast to typical flash arrays which are arranged in bit-planes. In one embodiment, a gate select transistor 122 and a source select transistor 124 are used to isolate the gates and sources of the byte 100, respectively, from the gates and sources of other bytes of the flash array. Furthermore, the drains of the bytes of the array are isolated. In one embodiment, the gate select transistor is a p-channel device that accommodates the use of a negative gate erase voltage, but the embodiment is not so limited. The byte-alterable flash array is scalable, bit programmable, and n-bit erasable, but the embodiment is not so limited. FIG. 4 is a flash array 400 comprising a number of bytes 100 of an embodiment of the present invention.

The flash array of one embodiment is a fully decoded array, but the embodiment is not so limited. A decoder 199 controls the selection of the bytes of the flash array using drain select signals 130, wordline signals 132, and source select signals 134. Fully decoding and isolating the flash cells on a per-byte basis allow for a high number of program/erase cycles by effectively eliminating the effects of disturb voltages. In some embodiments, it is believed the number of program/erase cycles is approximately 100,000, wherein the high number of program/erase cycles are provided over a temperature range of approximately −40 degrees Celsius to approximately 125 degrees Celsius, but the embodiment is not so limited. This is in contrast to typical non-isolated flash arrays in which the long erase times and high programming voltages cause memory cells on common wordlines and bitlines to experience disturb conditions.

In an alternate embodiment, the gate is isolated on a byte basis, the source is isolated on a byte basis, and the drain is isolated on a bit basis, but the embodiment is not so limited. Therefore, each bitline has a separate drain select device. As such, there is no requirement to perform post erase repair (PER). Moreover, there is no requirement to perform pre-erase conditioning (PEC). The PER is performed on typical flash memory devices following erase in order to raise the threshold voltage on any cells in which the threshold voltage (Vtn) is below a prespecified value, but the embodiment is not so limited. The PER is a soft programming pulse used to raise the Vtn so that during read sensing leakage on the un-selected cell will not cause an error. In the byte-alterable array of one embodiment, a Vtn of zero volts is acceptable.

Figure 5:
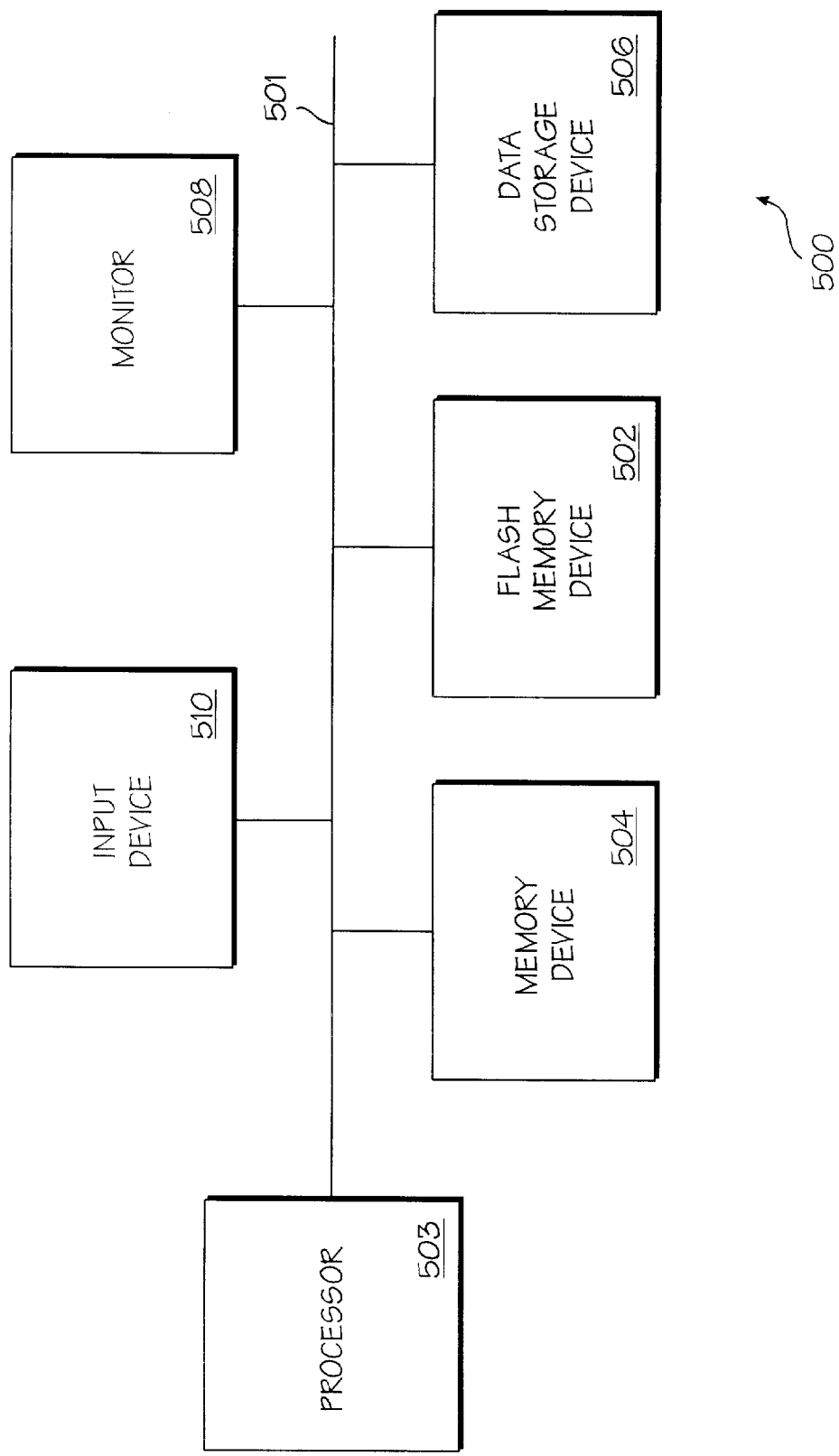
FIG. 5 is a computer system comprising the byte-alterable flash array of an embodiment of the present invention.

FIG. 5 is a computer system 500 comprising the byte-alterable flash array 502 of an embodiment of the present invention. The computer system 500 comprises a bus 501, or other communications hardware and software, for communicating information, and a processor 503 coupled to the bus 501 for processing information. The processor 503 comprises a central processing unit (CPU) and a microcontroller having any type of architecture, including complex instruction set computing (CISC) architecture or reduced instruction set computing (RISC) architecture. The computer system 500 further comprises a memory device 504 or other dynamic storage device coupled to the bus 501 for storing information and instructions to be executed by the processor 503. The flash memory device 502 may be used along with the memory device 504 or it may be used instead of the memory device 504. A data storage device 506, such as a magnetic disk or optical disk and a corresponding disk drive, is coupled to the bus 501. The computer system 500 may be coupled via the bus 501 to a display device 508, or monitor, for displaying information to a user of the computer system 500. An alphanumeric input device 510 may be coupled to the bus 501 for communicating information and command selections to the processor 503.

In one embodiment, the computer system 500 may be an embedded system comprising a processor 503 and a byte-alterable flash memory device 502. The flash memory device 502 may be implemented as an on-chip processor-independent peripheral, thereby providing EEPROM functionality on a single die using a flash memory device. This design reduces cost and complexity because of the elimination of hardware required and the additional serial protocol required to communicate with an off-chip memory device. This embedded system may be used in automotive and aviation applications to store frequently updated non-volatile parameters comprising adaptive parameters, fault codes, diagnostic information, and calibration parameters. Furthermore, this embedded system may be used to implement trim and configuration bits for general purpose flash memory devices.

While the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A memory device, comprising:
   a memory array, the memory array including:
      one or more blocks of memory cells, each memory cell within the one or more blocks includes a source and a drain, and
      wherein each block of memory cells includes,
         a source isolation device configured to isolate the source of each memory cell within the block from other blocks of memory cells, and
         a drain isolation device configured to isolate the drain of each memory cell within the block from other blocks of memory cells.

2. The memory device of claim 1, wherein the source isolation device is configured to isolate the source of each memory cell within the block from a source of a memory cell within other blocks of memory cells.

3. The memory device of claim 1, wherein the drain isolation device is configured to isolate the drain of each memory cell within the block from a drain of a memory cell within other blocks of memory cells.

4. The memory device of claim 1, wherein each memory cell within the one or more blocks of memory includes a gate.

5. The memory device of claim 4, wherein each block of memory cells further includes:

a gate isolation device configured to isolate the gate of each memory cell within the block from other blocks of memory cells.

6. The memory device of claim 5, wherein the gate isolation device is configured to isolate the gate of each memory within the block from a gate of a memory cell within other blocks of memory cells.

7. The memory device of claim 1, wherein the one or more blocks of memory cells are block alterable.

8. The memory device of claim 1, wherein the one or more blocks of memory cells are non-volatile memory.

9. The memory device of claim 1, wherein the one or more blocks of memory cells are non-volatile memory for a flash memory device.

\* \* \* \* \*